(12) United States Patent
Yoshida et al.

(10) Patent No.: US 7,807,557 B2
(45) Date of Patent: Oct. 5, 2010

(54) METHOD OF FORMING A SEMICONDUCTOR DEVICE HAVING A TRAPPING FILM FOR CHARGE ACCUMULATION

(75) Inventors: Koji Yoshida, Toyama (JP); Masataka Kusumi, Osaka (JP); Hiroaki Kuriyama, Kyoto (JP); Fumihiko Noro, Toyama (JP); Nobuyoshi Takahashi, Toyama (JP)

(73) Assignee: Panasonic Corporation, Osaka (JP)

( * ) Notice: Subject to any disclaimer, the term of this patent is extended or adjusted under 35 U.S.C. 154(b) by 16 days.

(21) Appl. No.: 11/806,887

(22) Filed: Jun. 5, 2007

(65) Prior Publication Data
US 2008/0048247 A1 Feb. 28, 2008

(30) Foreign Application Priority Data
Aug. 25, 2006 (JP) .............................. 2006-229673

(51) Int. Cl.
*H01L 21/76* (2006.01)
(52) U.S. Cl. .................. 438/591; 438/216; 438/696; 257/E21.679
(58) Field of Classification Search ................ 438/184, 438/197, 230, 267, 303, 595, 696, 591, 216, 438/287, 261, 585; 257/E21.659, E21.662, 257/E21.679
See application file for complete search history.

(56) References Cited

U.S. PATENT DOCUMENTS

| 4,603,059 | A | * | 7/1986 | Kiyosumi et al. | ............ | 438/396 |
| 5,539,154 | A | * | 7/1996 | Nguyen et al. | .......... | 174/138 C |
| 6,962,862 | B2 | * | 11/2005 | Kumamoto | .................. | 438/595 |
| 7,241,632 | B2 | * | 7/2007 | Yang | .............................. | 438/3 |

FOREIGN PATENT DOCUMENTS

| JP | 2000-091450 | 3/2000 |
| JP | 2001-077220 | 3/2001 |

* cited by examiner

*Primary Examiner*—Davienne Monbleau
*Assistant Examiner*—Dilinh P Nguyen
(74) *Attorney, Agent, or Firm*—McDermott Will & Emery LLP

(57) ABSTRACT

A semiconductor device includes: source/drain regions formed in a semiconductor substrate; a trapping film for storing information by accumulating charges, the trapping film being formed in a region on the semiconductor substrate which includes a region on a channel region between the source/drain regions; and gate electrodes formed on the trapping film. A silicon nitride film containing carbon is formed by low pressure CVD using an organic material so as to cover the gate electrodes and a part of the trapping film which is located between adjacent gate electrodes.

10 Claims, 13 Drawing Sheets

A-A'

B-B'

A-A'

B-B'

A-A'

B-B'

C-C'

A-A'            B-B'

712

METHOD OF FORMING A SEMICONDUCTOR DEVICE HAVING A TRAPPING FILM FOR CHARGE ACCUMULATION

CROSS REFERENCE TO RELATED APPLICATIONS

This Non-provisional application claims priority under 35 U.S.C. §119(a) on Patent Application No. 2006-229673 filed in Japan on Aug. 25, 2006, the entire contents of which are hereby incorporated by reference.

BACKGROUND OF THE INVENTION

The present invention relates to semiconductor devices and fabrication methods thereof, and particularly relates to a semiconductor device including a trapping film for charge accumulation and word lines which are provided in a MONOS nonvolatile semiconductor memory device and a fabrication method thereof.

MONOS (metal-oxide-nitride-oxide-semiconductor) nonvolatile semiconductor memory devices are nonvolatile semiconductor memory devices for accumulating charges in an ONO film of a layered structure in which a silicon oxide layer, a silicon nitride layer, and a silicon oxide layer are layered sequentially. Of various types of MONOS nonvolatile semiconductor memory devices proposed heretofore, a nonvolatile semiconductor memory element including an ONO film for storing information by locally accumulating charges receives attention for its suitability to increase density and performance and to reduce power consumption. This nonvolatile semiconductor element includes bit lines formed in a semiconductor substrate, the ONO film formed on a channel region, and word lines formed on the bit lines so as to be intersected at a right angle with the bit lines.

Such a conventional nonvolatile semiconductor memory device will be described with reference to FIG. 6A to FIG. 6D, and a fabrication method thereof will be described with reference to FIG. 7A(a) to FIG. 7A(a), FIG. 7B(a) to FIG. 7B(e), and FIG. 7C (see, for example, Japanese Patent Application Laid Open Publication No. 2001-77220A and Japanese Patent Application Laid Open Publication No. 2000-91450A).

FIG. 6A is a plan view of the conventional semiconductor device which includes bit lines 607 and word liens (gate electrodes) 603 formed on the bit lines 607 so as to be intersected at a right angle with the bit liens 607.

As shown in FIG. 6B, which is a sectional view taken along the line A-A' in FIG. 6A, there are provided: an ONO film 602 as a trapping film on a first conductivity type semiconductor substrate 601; word lines 603 on the ONO film 602; first silicon nitride films 604 formed by low pressure CVD on the side faces of the word lines 603 and the side face of the ONO film 602; and a second silicon nitride film 605 formed by plasma CVD or low pressure CVD and covering the surfaces of the word lines 603, the surfaces of the first silicon nitride films 604, and the surface of the semiconductor substrate 601.

As shown in FIG. 6C, which is a sectional view taken along the line B-B' in FIG. 6A, there are provided: the ONO film 602 as a trapping film on the first conductivity type substrate 601; a plurality of opening portions formed in the ONO film 602 in the lateral direction of the word lines 603; second conductivity type diffusion bit lines 607 in regions of the semiconductor substrate 601 which are located below the openings; oxide insulating films 606 on the diffusion bit lines 607; the word lines 603 on the surface of the ONO film 602, the side face of the ONO film 602, and the surfaces of the oxide insulating films 606; and the second silicon nitride film 605 formed by plasma CVD or low pressure CVD and covering the surfaces of the word lines 603.

As shown in FIG. 6D, which is a sectional view taken along the line C-C' in FIG. 6A, there are provided: the second conductivity type diffusion bit lines 607 in the first conductivity type semiconductor substrate 601; the oxide insulating films 606 on the diffusion bit lines 607; the word lines 603 on the oxide insulating films 606; the first silicon nitride films 604 formed by low pressure CVD on the side faces of the word lines 603 and the side faces of the oxide insulating films 606; and the second silicon nitride film 605 formed by plasma CVD or low pressure CVD and covering the surfaces of the word lines 603, the surfaces of the first silicon nitride films 604, and the surfaces of the diffusion bit lines 607.

A conventional semiconductor device fabrication method will be described next with reference to FIG. 7A, FIG. 7B, and FIG. 7C which correspond to the sectional views taken along the lines A-A' and B-B' in FIG. 6.

First, as shown in FIG. 7A(a), an ONO film 702 as a trapping film is formed on a first conductivity type semiconductor substrate 701.

Next, as shown in FIG. 7A(b), a resist pattern 703 that defines the positions to be a plurality of bit lines are formed on the ONO film 702.

Subsequently, as shown in FIG. 7A(c), the upper part of the ONO film 702 is removed with the use of the resist pattern 703 as a mask. Though the lower part of the ONO film 702 is left herein, the ONO film 702 is removed until the semiconductor substrate 701 is exposed in some cases.

Thereafter, as shown in FIG. 7A(d), second conductivity type impurity ion is implanted to the semiconductor substrate 701 with the use of the resist pattern 7103 as a mask though the remaining lower part of the NON film 702 to form a plurality of second conductivity type diffusion layers 704 in regions of the semiconductor substrate 701 which are located below the openings of the resist pattern 703.

Next, the resist pattern 703 is removed, as shown in FIG. 7A(e), and then, accelerated oxidation is performed on each diffusion layer 704, as shown in FIG. 7A(f). The accelerated oxidation forms an oxide insulating film 705 formed of a silicon oxide film in the upper part of each diffusion layer 704 while at the same time activating the implanted impurity ion to thus form bit lines 706 formed of the diffusion layers 704.

Subsequently, as shown in FIG. 7A(g), conductive polysilicon 707 is deposited on the surface of the ONO film 702, the side face of the ONO film 702, and the surfaces of the oxide insulating films 705.

Thereafter, as shown in FIG. 7B(a), a resist pattern 708 that defines positions to be a plurality of word lines so that the word lines are intersected at a right angle with the bit lines 706 is formed on the surface of the thus deposited polysilicon 707.

Next, as shown in FIG. 7B(b), the polysilicon 707 is removed with the use of the resist pattern 708 as a mask to form word lines (gate electrodes) 709 formed of the polysilicon 707. Herein, the ONO film 702 is removed until the semiconductor substrate 701 is exposed.

Subsequently, the resist pattern 708 is removed, as shown in FIG. 7B(c), and then, a first silicon nitride film 710 is formed by low pressure CVD on the surfaces of the word lines 709, the side faces of the word lines 709, the side face of the ONO film 702, and the surface of the semiconductor substrate 701, as shown in FIG. 7B(d).

Thereafter, as shown in FIG. 7B(e), the silicon nitride film 710 is removed by anisotropic etching to form sidewalls 711 formed of the first silicon nitride film 710 on the side faces of the word lines 709 and the side face of the ONO film 702.

Finally, as shown in FIG. 7C, a second silicon nitride film 712 is formed by plasma CVD or low pressure CVD so as to cover the surfaces of the word lines 709, the surfaces of the sidewalls 711, and the surface of the semiconductor substrate 701. Thus, the conventional nonvolatile semiconductor memory device is completed.

SUMMARY OF THE INVENTION

The inventors have exhausted various examinations to find that the conventional nonvolatile semiconductor memory device fabrication method involves adverse influence by plasma charged in the ONO film 602 in the fabrication step and fixed charges in the ONO film 602 to degrade the data storage characteristics. Further, the inventors have also pinned down the following two factors of degrading the data storage characteristics.

One of the factors is that: when the second silicon nitride film 605 is formed by plasma CVD, the potential of the word lines 603 increases due to the presence of the plasma in formation of the second silicon nitride film 605 to cause the trapping film 602 to charge the plasma, thereby degrading the data storage characteristics.

Specifically, as shown in FIG. 8A, when electrons 809 is injected locally to the trapping film 802 in writing operation in the case where holes 808 are charged to the ONO film 802, the holes 808 in the ONO film 802 neutralize the electrons 809, so that electron distribution 810 immediately after writing is changed to broad distribution 811 as time elapses, as shown in FIG. 8B. This lowers the threshold voltage of the memory transistors, thereby degrading the data storage characteristics. With no charging to the ONO film 802, as shown in FIG. 8D, in contrast, no difference is observed between the electron distribution 810 immediately after writing and the electron distribution 811 after lapse of time, as shown in FIG. 8E, which means no degradation of the data storage characteristics, as shown in FIG. 8F.

Referring to the other factor, the amount of hydrogen bonding in the silicon nitride film 605 is smaller when formed by low pressure CVD than when formed by plasma CVD, thereby increasing the fixed charges in the ONO film 602 to degrade the data storage characteristics.

Specifically, the inventors have found experimentally that when a silicon nitride film 906 having a small amount of hydrogen bonding is formed, as shown in FIG. 9A, hydrogen is less eliminated from the silicon nitride film 906 in temperature rise in the post process to increase positive fixed charges 908 in the ONO film 902 (FIG. 10). With the positive fixed charges 908 increased, when electrons 909 are injected locally to the ONO film 902 in writing operation, the positive fixed charges 908 in the ONO film 902 neutralize the electrons 909 to cause electron distribution 910 immediately after writing to change to broad distribution 911 as time elapses, as shown in FIG. 9B, thereby lowering the threshold voltage of the memory transistors, as shown in FIG. 9C. Thus, the data storage characteristics are degraded. In contrast, when hydrogen is supplied to the ONO film 902 as shown in FIG. 9D, generation of the positive fixed charges in the ONO film 902 is suppressed. Accordingly, as shown in FIG. 9E, no difference is observed between the distribution 910 immediately after writing and the electron distribution 911 after lapse of time, and hence, no degradation of the data storage characteristics is observed, as shown in FIG. 9F.

Accordingly, the present invention has its object of obtaining a highly reliable semiconductor device by solving the above conventional problems, namely, by preventing data storage characteristics of memory cells having a trapping film from being degraded.

To solve the above problems, a semiconductor device of the present invention includes a silicon nitride film formed on a memory cell, wherein the silicon nitride film is made of an organic material and has an amount of hydrogen bonding larger than a silicon nitride film made of conventionally used materials, namely, mono-silane ($SiH_4$) and ammonia ($NH_3$). A fabrication method of the present invention includes the steps of forming gate electrodes on the surface of a trapping film, and forming, on the gate electrodes and the trapping film by low pressure CVD utilizing an organic material, a silicon nitride film having an amount of hydrogen bonding larger than a silicon nitride film made of the conventionally used materials of mono-silane and ammonia.

This prevents charging to the trapping film and suppresses an increase in positive fixed charges in the trapping film, thereby preventing the data storage characteristics of the memory cells from being degraded to attain a highly reliable semiconductor device.

Specifically, a semiconductor device of the present invention includes: source/drain regions formed in a semiconductor substrate; a trapping film for storing information by accumulating charges, the trapping film being formed in a region on the semiconductor substrate which includes a region on a channel region between the source/drain regions; gate electrodes formed on the trapping film; and a silicon nitride film containing carbon and formed by low pressure CVD using an organic material, the silicon nitride film covering the gate electrodes and a part of the trapping film which is located between adjacent gate electrodes.

In the semiconductor device of the present invention, it is preferable to further include: a silicon oxide film intervening between the silicon nitride film containing carbon and a part of the trapping film which is located between the adjacent gate electrodes.

In the semiconductor device of the present invention, preferably, the trapping film is an insulating film containing nitrogen.

In the semiconductor device of the present invention, preferably, the silicon nitride film containing carbon has a thickness in a range between 5 nm and 100 nm, both inclusive.

In the semiconductor device of the present invention, preferably, the silicon nitride film containing carbon has an amount of hydrogen bonding in a range between $10^{20}$ and $10^{24}$ counts/$cm^3$, both inclusive.

In the semiconductor device of the present invention, preferably, the silicon nitride film containing carbon has a hydrogen concentration in a range between $10^{20}$ and $10^{24}$ atoms/$cm^3$, both inclusive, and a carbon concentration in a range between $10^{18}$ and $10^{24}$ atmos/$cm^3$, both inclusive.

A semiconductor device fabrication method according to the present invention includes: a first step of forming source/drain regions in a semiconductor substrate; a second step of forming, in a region on the semiconductor substrate which includes a region on a channel region between the source/drain regions, a trapping film that stores information by accumulating charges; a third step of forming gate electrodes on the trapping film; and a fourth step of forming a silicon nitride film by low pressure CVD using an organic material so as to cover the gate electrodes and a part of the trapping film which is located between adjacent gate electrodes.

In the semiconductor device fabrication method of the present invention, it is preferable to further include, after the third step and before the fourth step, the steps of: forming a silicon oxide film on a part of the trapping film which is located between the adjacent gate electrodes; and leaving the silicon oxide film buried between the gate electrodes by removing a part of the silicon oxide film by anisotropic etching until the surfaces of the gate electrodes are exposed.

In the semiconductor device fabrication method of the present invention, preferably, the organic material includes at least one of bis(tertiary-butylamino)silane and hexamethyldisilazane.

In the semiconductor device fabrication method of the present invention, it is preferable to further include the step of: performing thermal treatment after the fourth step.

In the semiconductor device fabrication method of the present invention, preferably, the thermal treatment is performed at a temperature between 400° C. and 1100° C., both inclusive.

In the semiconductor device fabrication method of the present invention, preferably, the thermal treatment is performed for a period between one minute and 60 minutes, both inclusive.

In the semiconductor device fabrication method of the present invention, preferably, the trapping film is an insulating film containing nitrogen.

In the semiconductor device fabrication method of the present invention, preferably, the silicon nitride film has a thickness in a range between 5 nm and 100 nm, both inclusive.

In the semiconductor device fabrication method of the present invention, preferably, the silicon nitride film has an amount of hydrogen bonding in a range between $10^{20}$ and $10^{24}$ counts/cm$^3$, both inclusive.

In the semiconductor device fabrication method of the present invention, preferably, the silicon nitride film has a hydrogen concentration in a range between $10^{20}$ and $10^{24}$ atoms/cm$^3$, both inclusive, and a carbon concentration in a range between $10^{18}$ and $10^{24}$ atmos/cm$^3$, both inclusive.

In short, in the semiconductor device and the fabrication method thereof according to the present invention, the silicon nitride film having an amount of hydrogen bonding larger than a silicon nitride film made of the conventionally used materials of mono-silane (SiH$_4$) and ammonia (NH$_3$) is formed on the memory cells by low pressure CVD using the organic material, so that charging to the trapping film is prevented, an increase in positive fixed charges in the trapping film is suppressed, and an increase in fixed charges in the oxide insulating film between the gate electrodes is suppressed, thereby preventing the data storage characteristics of the memory cells from being degraded to increase the reliability of the semiconductor device.

DESCRIPTION OF THE PREFERRED EMBODIMENTS

Embodiments of the present invention will be described below with reference to the accompanying drawings.

Embodiment 1: Structure

Figure 1A:
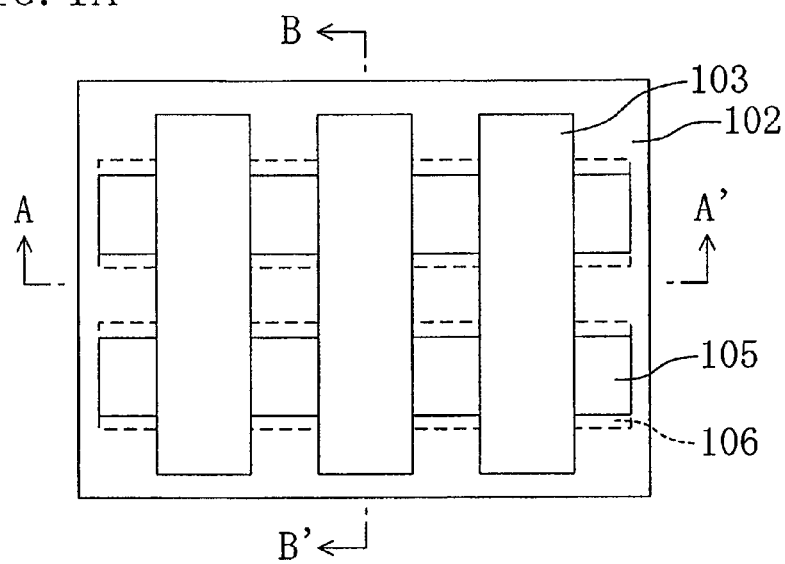
FIG. 1A is a plan view and FIG. 1B and FIG. 1C are sectional views for showing a structure of a semiconductor device according to Embodiment 1 of the present invention.
Figure 1B:
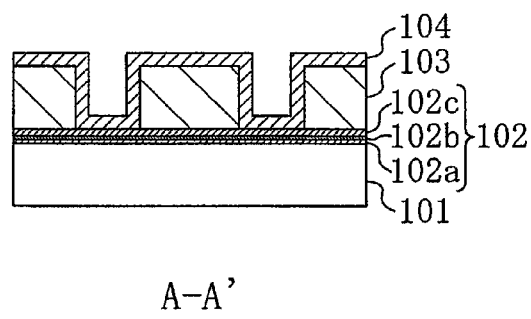
Figure 1C:
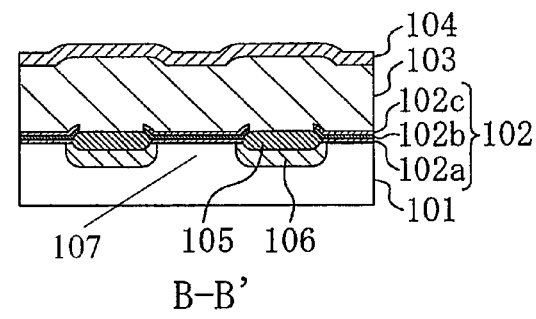

FIG. 1A to FIG. 1C show a structure in plan or section of a semiconductor device according to Embodiment 1 of the present invention.

FIG. 1A is a plan view of the semiconductor device that includes bit lines 106 and word lines (gate electrodes) 103 made of polysilicon and formed on the bit lines 106 so as to be intersected at a right angle with the bit lines 106.

FIG. 1B is a sectional view taken along the line A-A' in FIG. 1A. As shown in FIG. 1B, there are provided: a first silicon oxide (SiO$_2$) film 102a having a thickness of approximately 5 nm on the principal surface of a semiconductor substrate 101 made of p-type silicon (Si); a silicon nitride (SiN) film 102b having a thickness of approximately 5 nm on the first silicon oxide film 102a; and a second silicon oxide film 102c having a thickness of approximately 10 nm on the silicon nitride film 102b. Thus, an ONO film (a trapping film)

102 formed of the first silicon oxide film 102a, the silicon nitride film 102b, and the second silicon oxide film 102c is formed on the principal surface of the semiconductor substrate 101. The silicon nitride film 102b that accumulates charges may be replaced by a charge accumulation film (an insulating film) made of silicon oxynitride (SiON).

The semiconductor device of the present embodiment further includes a plurality of word lines 103 made of polysilicon on the ONO film 102 and a silicon nitride film 104 formed by low pressure CVD using an organic material on the surfaces of the word lines 103, the side faces of the word liens 103, and the surface of the ONO film 102. The silicon nitride film 104 has a thickness of approximately 30 nm, an amount of hydrogen bonding of approximately $5 \times 10^{22}$ counts/cm$^3$, a hydrogen content of approximately $5 \times 10^{22}$ atoms/cm$_3$, and a carbon content of approximately $5 \times 10^{21}$ atoms/cm$^3$.

FIG. 1C is a sectional view taken along the line B-B' in FIG. 1A. As shown in FIG. 1C, there are provided: the first silicon oxide (SiO$_2$) film 102a having a thickness of approximately 5 nm on the principal surface of the semiconductor substrate 101 made of p-type silicon (Si); the silicon nitride (SiN) film 102b having a thickness of approximately 5 nm on the first silicon oxide film 102a; and the second silicon oxide film 102c having a thickness of approximately 10 nm on the silicon nitride film 102b. Thus, the ONO film 102 formed of the first silicon oxide film 102a, the silicon nitride film 102b, and the second silicon oxide film 102c is formed on the principal surface of the semiconductor substrate 101, including a channel region 107 between source/drain regions.

Further, the semiconductor device of the present embodiment includes: a plurality of opening portions formed in the ONO film 102 in the lateral direction of the word lines 103; diffusion bit lines 106 in regions of the semiconductor substrate 101 which are located below the opening portions; oxide insulating films 105 on the diffusion bit lines 106; the word lines 103 made of polysilicon on the surface of the ONO film 102, the side face of the ONO film 102, and the surfaces of the oxide insulating films 105; and the silicon nitride film 104 formed by low pressure CVD using an organic material on the surfaces of the word lines 103. The silicon nitride film 104 has a thickness of approximately 30 nm, an amount of hydrogen bonding of approximately $5 \times 10^{22}$ counts/cm$^3$, a hydrogen content of approximately $5 \times 10^{22}$ atoms/cm$^3$, and a carbon content of approximately $5 \times 10^{21}$ atoms/cm$^3$.

As described above, in Embodiment 1, the silicon nitride film 104 is formed by low pressure CVD using an organic material so that no plasma is charged to the ONO film 102, and the silicon nitride film 104 has a comparatively large amount of hydrogen bonding of approximately $5 \times 10^{22}$ counts/cm$^3$ so that generation of fixed charges in the ONO film 102 is suppressed. Hence, the data storage characteristics of the semiconductor device are prevented from being degraded.

Embodiment 1: First Fabrication Method

Figure 2A:
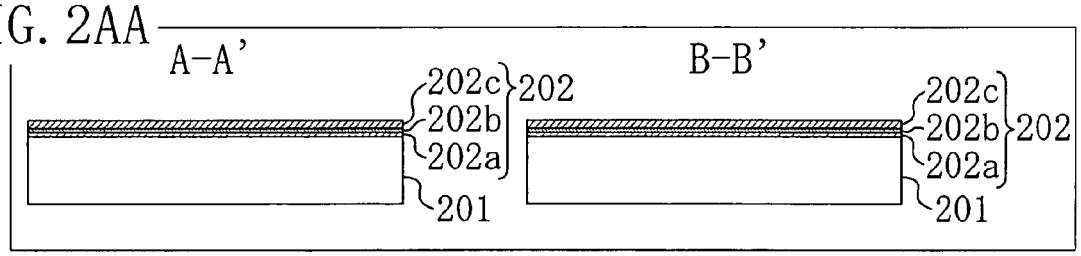
FIG. 2A(a) to FIG. 2A(g) are sectional views showing steps of a first semiconductor device fabrication method according to Embodiment 1 of the present invention.
Figure 2A:
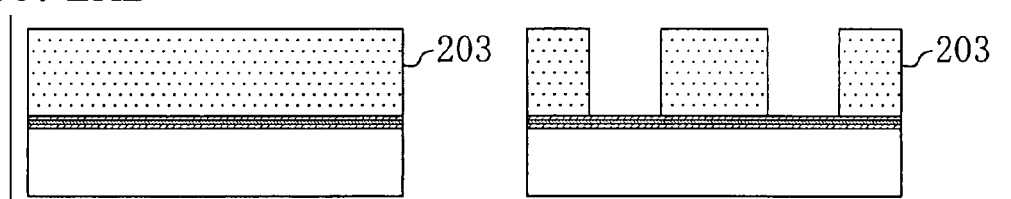
Figure 2A:
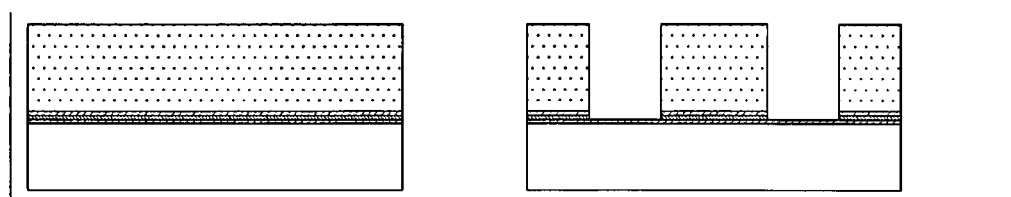
Figure 2A:
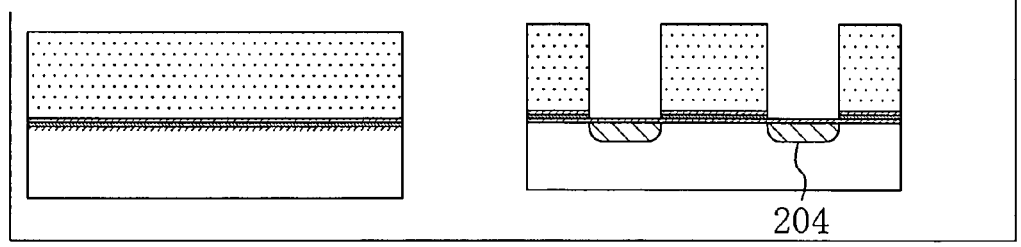
Figure 2A:
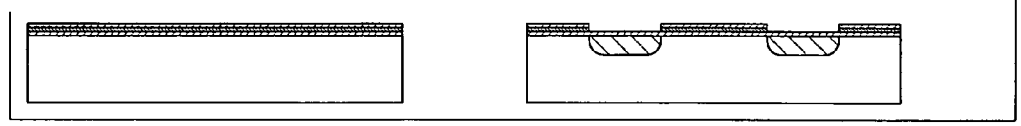
Figure 2A:
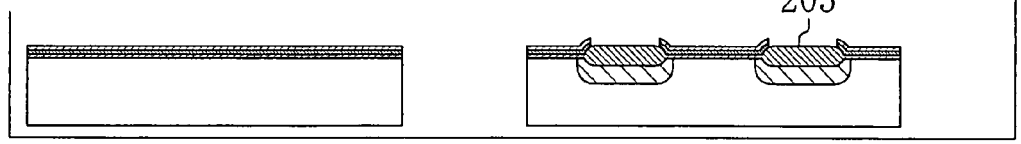
Figure 2A:
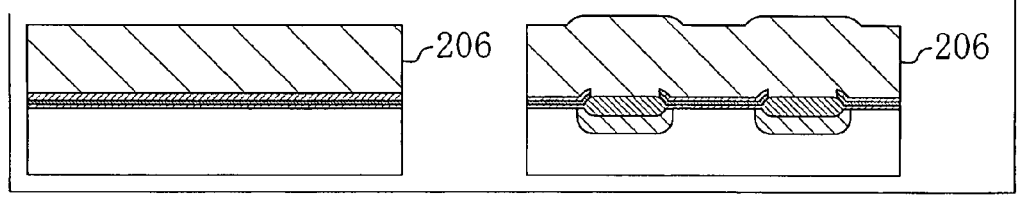
Figure 2B:
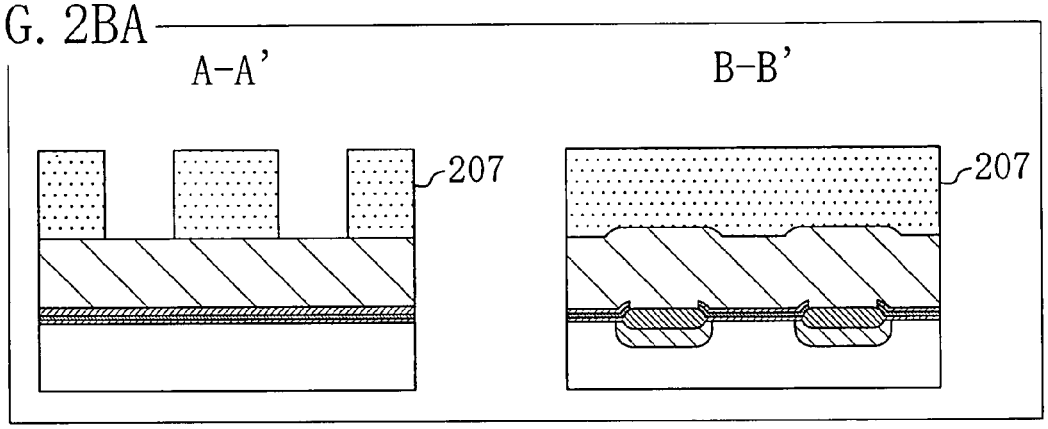
FIG. 2B(a) to FIG. 2B(d) are sectional views showing steps of the first semiconductor device fabrication method according to Embodiment 1 of the present invention.
Figure 2B:
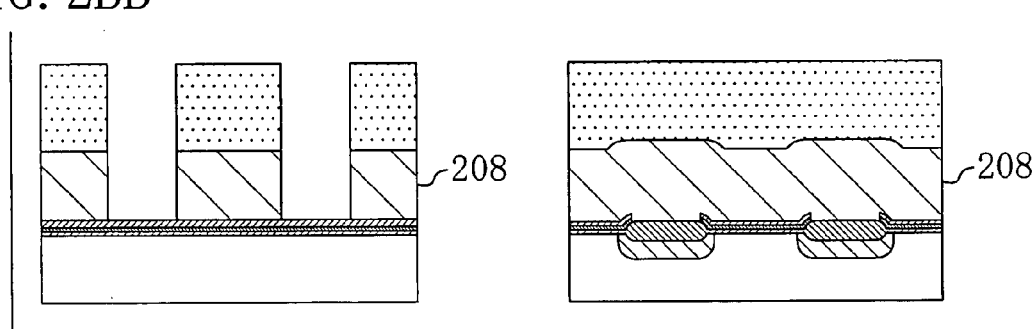
Figure 2B:
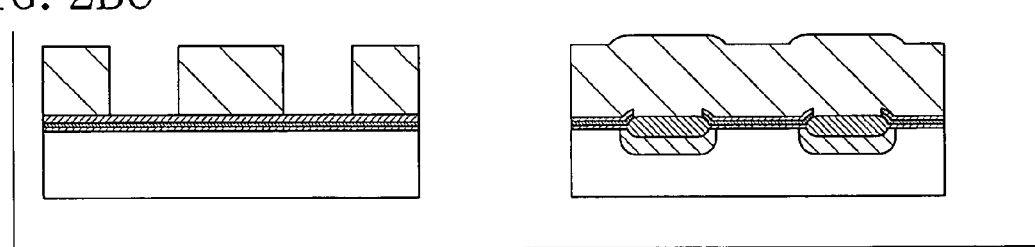
Figure 2B:
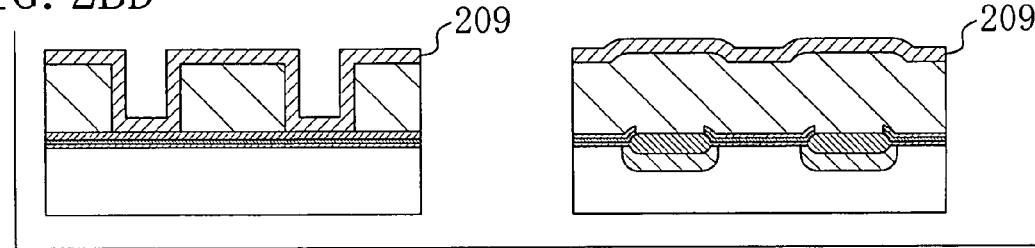

FIG. 2A(a) to FIG. 2A(g) and FIG. 2B(a) to FIG. 2(d) are sectional views taken along the lines A-A' and B-B' in FIG. 1A for showing in respective steps of a semiconductor device fabrication method according to Embodiment 1 of the present invention.

First, as shown in FIG. 2A(a), thermal oxidation is performed on the principal surface of a semiconductor substrate 201 made of p-type silicon (Si) under an oxidizing atmosphere at a temperature of, for example, approximately 800° C. to form a first silicon oxide (SiO$_2$) film 202a having a thickness of approximately 5 nm on the principal surface of the semiconductor substrate 201. Then, low pressure CVD in which deposition temperature is, for example, approximately 700° C. is performed to deposit a silicon nitride (SiN) film 202b having a thickness of approximately 10 nm on the first silicon oxide film 202a. Further, thermal oxidation is performed on the thus deposited silicon nitride film 202b under an oxidizing atmosphere at a temperature of approximately 1000° C. to form a second silicon oxide film 202c having a thickness of approximately 10 nm on the silicon nitride film 202b. Thus, an ONO film (a trapping film) 202 formed of the first silicon oxide film 202a (5 nm), the silicon nitride film 202b (5 nm), and the second silicon oxide film 202c (10 nm) is formed on the principal surface of the semiconductor substrate 201. The silicon nitride film 202b that accumulates charges may be replaced by a charge accumulation film (an insulating film) made of silicon oxynitride.

Next, as shown in FIG. 2A(b), photolithography is performed to form on the ONO film 202 a resist pattern 203 that defines a plurality of bit line formation regions.

Subsequently, as shown in FIG. 2A(c), dry etching is performed with the use of the thus formed resist pattern 203 as a mask to remove parts of the ONO film 202 which are included in the bit line formation regions for forming opening portions in the ONO film 202. Herein, the first silicon oxide film 202a of the ONO film 202 is left by the thickness of approximately 3 nm so as to serve as a protection film for the semiconductor substrate 201 in the next ion implantation step. Wherein, the first silicon oxide film 202a of the ONO film 202 may be removed thoroughly.

Thereafter, as shown in FIG. 2A(d), arsenic ion as an n-type impurity ion is implanted to the semiconductor substrate 201 with the use of the resist pattern 203 as a mask under implantation conditions of an injection energy of approximately 50 keV and a dosage of approximately $3 \times 10^{15}$ cm$^{-2}$ to form in the upper part of the semiconductor substrate 201 a plurality of n-type diffusion layers 204, as source/drain regions, which are to be bit lines.

Next, as shown in FIG. 2A(e), the resist pattern 203 is removed by ashing and cleaning.

Subsequently, as shown in FIG. 2A(f), thermal oxidation is performed under an oxidizing atmosphere at a temperature of, for example, 850° C. for accelerated-oxidizing the upper parts of the n-type diffusion layers 204 to form bit line oxide films (oxide insulating films) having a thickness of, for example, approximately 50 nm. This thermal treatment activates, at the same time, arsenic ion as a donor implanted in the n-type diffusion layers 204.

Thereafter, as shown in FIG. 2A(g), a conductive film 206 made of polysilicon is deposited by, for example, low pressure CVD on the surface of the ONO film 202, the side face of the ONO film 202, and the surfaces of the bit line oxide films 205.

Next, as shown in FIG. 2B(a), photolithography is performed to form on the conductive film 206 a resist pattern 207 that defines a plurality of word lines.

Subsequently, as shown in FIG. 2B(b), dry etching is performed with the use of the thus formed resist pattern 207 as a mask to form word lines 208.

Thereafter, as shown in FIG. 2B(c), the resist pattern 207 is removed by ashing and cleaning.

Next, as shown in FIG. 2B(d), low pressure CVD using bis(tertiary-butylamino)silane (BTBAS) as a material thereof is performed to form a silicon nitride film 209 that covers the surfaces of the word lines, the side faces of the word lines, and the surface of the ONO film, wherein the silicon nitride film 209 has a thickness in the range between 5 nm and 100 nm, both inclusive (approximately 30 nm in the present embodiment as one example), an amount of hydrogen bonding in a range $10^{20}$ between $10^{24}$ counts/cm$^3$, both inclusive (approximately $5 \times 10^{22}$ counts/cm$^3$ in the present embodiment as one embodiment), a hydrogen content in the range between $10^{20}$ and $10^{24}$ atoms/cm$^3$, both inclusive (approximately $5 \times 10^{22}$ atoms/cm$^3$ in the present embodiment as one embodiment), and a carbon content in the range between $10^{18}$ and $10^{24}$ atmos/cm$^3$, both inclusive (approximately $5 \times 10^{21}$ atoms/cm$^3$ in the present embodiment as one embodiment). Bis(tertiary-butylamino)silane (BTBAS) may be replaced by hexamethyldisilazane (HMDS).

As described above, in the present embodiment, the silicon nitride film 209 is formed by low pressure CVD using an organic material so that no plasma charging to the ONO film 202 is caused. Further, the low pressure CVD uses bis(tertiary-butylamino)silane (BTBAS) or hexamethyldisilazane (HMDS) as a material thereof so that the thus formed silicon nitride film 209 has an amount of hydrogen bonding of approximately $5 \times 10^{22}$ counts/cm$^3$, which is comparatively larger than a silicon nitride film formed by low pressure CVD using the conventionally used materials of silane (SiH$_4$) and ammonia (NH$_3$), with a result that generation of fixed charges in the ONO film 202 is suppressed. Hence, the data storage characteristics of the semiconductor device are prevented from being degraded.

Embodiment 1: Second Fabrication Method

Figure 3:
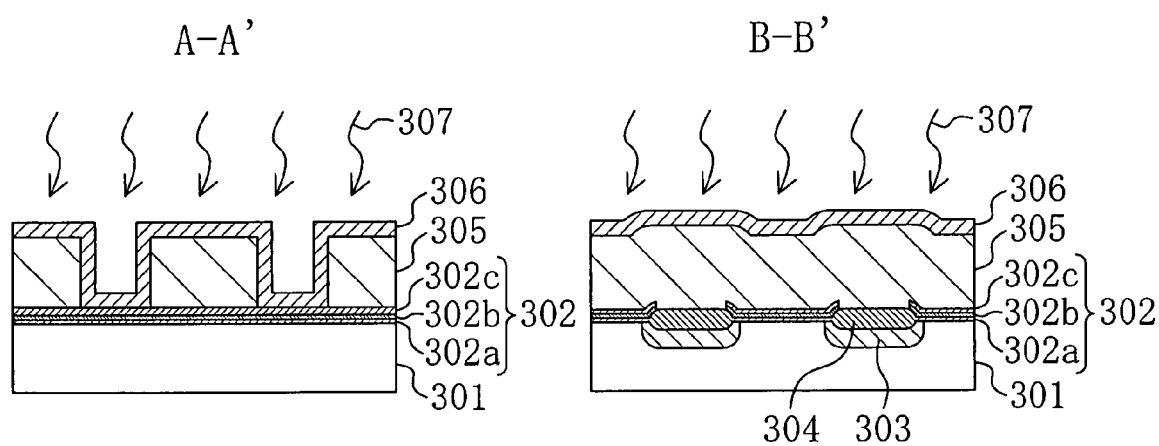
FIG. 3 presents sectional views showing a step of a second semiconductor device fabrication method according to Embodiment 1 of the present invention.

FIG. 3 presents sectional views taken along the lines A-A' and B-B' in FIG. 1A for showing a step of another semiconductor device fabrication method according to the present embodiment.

Herein, the former steps of the second fabrication method in the present embodiment are just the same as those shown in FIG. 2A and FIG. 2B, and therefore, description thereof is omitted.

After the steps shown in FIG. 2A and FIG. 2B, thermal treatment is performed under a nitrogen atmosphere at a temperature in the range between, for example, 400° C. and 1100° C., both inclusive (650° C. in the present embodiment as one example) for a period of one minute to 60 minutes, both inclusive (30 minute in the present embodiment as one example) to eliminate hydrogen from a silicon nitride film 306. The thermal treatment may be performed after deposition of an interlayer insulating film on the silicon nitride film 306.

This promotes elimination of hydrogen from the silicon nitride film and suppresses an increase in positive fixed charges in the trapping film, with a result that the data storage characteristics of the memory cells are prevented from being degraded, attaining a highly reliable semiconductor device.

As described above, in the present embodiment, thermal treatment is performed after formation of the silicon nitride film 306 to eliminate hydrogen forcedly from the silicon nitride film 306 for supplying the thus eliminated hydrogen to the ONO film 302. This further suppresses generation of fixed charges in the ONO film 302, leading to efficient prevention of degradation of the data storage characteristics of the semiconductor device.

Embodiment 2: Structure

Figure 4A:
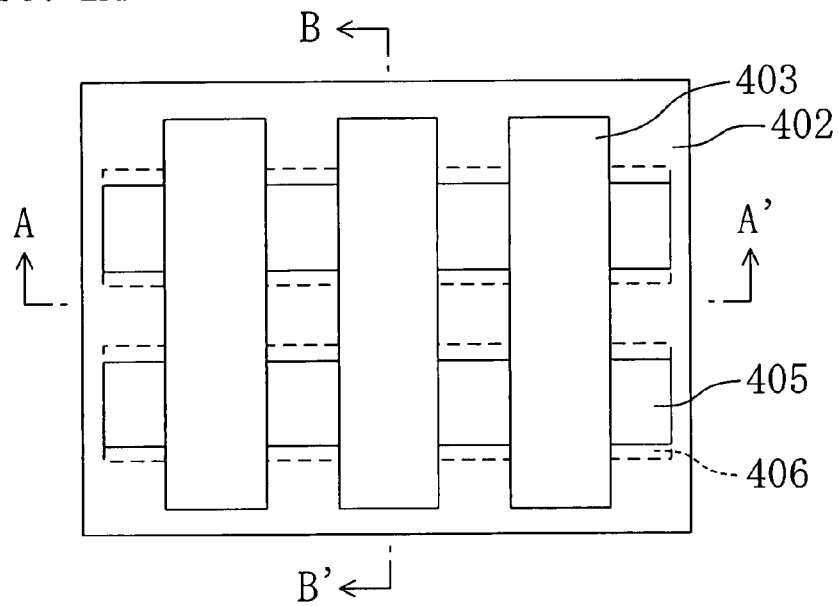
FIG. 4A is a plan view and FIG. 4B and FIG. 4C are sectional views for showing a structure of a semiconductor device according to Embodiment 2 of the present invention.
Figure 4B:
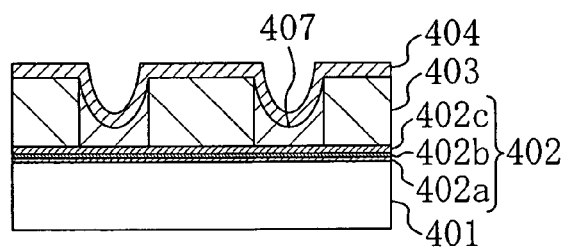
Figure 4C:
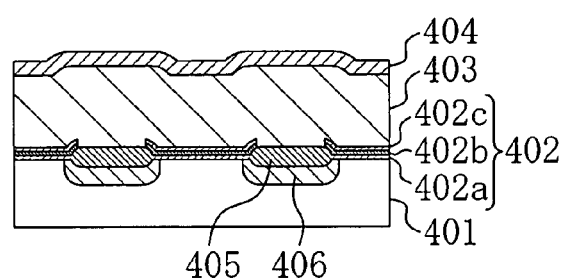

FIG. 4A to FIG. 4C show a structure in plan or section of a semiconductor device according to the present embodiment.

FIG. 4A is a plan view of the semiconductor device that includes bit lines 406 and word lines 403 made of polysilicon and formed on the bit lines 406 so as to intersect at a right angle with the bit lines 406.

FIG. 4B is a sectional view taken along the line A-A' in FIG. 4A. As shown in FIG. 4B, there are provided: a first silicon oxide (SiO$_2$) film 402a having a thickness of approximately 5 nm on the principal surface of a semiconductor substrate 401 made of p-type silicon (Si); a silicon nitride (SiN) film 402b having a thickness of approximately 5 nm on the first silicon oxide film 402a; and a second silicon oxide film 402c having a thickness of approximately 10 nm on the silicon nitride film 402b. Thus, an ONO film (a trapping film) 402 formed of the first silicon oxide film 402a, the silicon nitride film 402b, and the second silicon oxide film 402c is formed on the principal surface of the semiconductor substrate 401. The silicon nitride film 402b that accumulates charges may be replaced by a charge accumulation film (an insulating film) made of silicon oxynitride (SiON).

The semiconductor device further includes a plurality of word lines 403 made of polysilicon on the ONO film 402 and oxide insulating films 407 on the side faces of the word lines 403 and the surface of the ONO film 402 so that the oxide insulating films 407 are buried between the word lines 403. Additionally, a silicon nitride film 404 formed by low pressure CVD using an organic material is provided on the surfaces of the word lines 403 and the surfaces of the oxide insulating films 407. The silicon nitride film 404 has a thickness of approximately 30 nm, an amount of hydrogen bonding of approximately $5 \times 10^{22}$ counts/cm$^3$, a hydrogen content of approximately $5 \times 10^{22}$ atoms/cm$^3$, and a carbon content of approximately $5 \times 10^{21}$ atoms/cm$^3$.

FIG. 4C is a sectional view taken along the line B-B' in FIG. 4A. As shown in FIG. 4C, there are provided: the first silicon oxide (SiO$_2$) film 402a having a thickness of approximately 5 nm on the principal surface of the semiconductor substrate 401 made of p-type silicon (Si); the silicon nitride (SiN) film 402b having a thickness of approximately 5 nm on the first silicon oxide film 402a; and the second silicon oxide film 402c having a thickness of approximately 10 nm on the silicon nitride film 402b. Thus, the ONO film 402 formed of the first silicon oxide film 402a, the silicon nitride film 402b, and the second silicon oxide film 402c is formed on the principal surface of the semiconductor substrate 401.

Further, the semiconductor device of the present embodiment includes: a plurality of opening portions formed in the ONO film 402 in the lateral direction of the word lines 403; diffusion bit lines 406 in regions of the semiconductor substrate 401 which are located below the opening portions; oxide insulating films 405 on the diffusion bit lines 406; the word lines 403 made of polysilicon on the surface of the ONO film 402, the side face of the ONO film 402, and the surfaces of the oxide insulating films 405; and the silicon nitride film 404 formed by low pressure CVD using an organic material on the surfaces of the word lines 403. The silicon nitride film 404 has a thickness of approximately 30 nm, an amount of hydrogen bonding of approximately $5 \times 10^{22}$ counts/cm$^3$, a hydrogen content of approximately $5 \times 10^{22}$ atoms/cm$^3$, and a carbon content of approximately $5 \times 10^{21}$ atoms/cm$^3$.

As described above, in Embodiment 2, the silicon nitride film 404 is formed by low pressure CVD using an organic material to thus cause no plasma charging to the ONO Film 402, and the silicon nitride film 404 has a comparatively large amount of hydrogen bonding of approximately $5 \times 10^{22}$ counts/cm$^3$ to thus suppress generation of fixed charges in the ONO film 402. Further, the silicon nitride film 404, which has a comparatively large amount of hydrogen bonding of approximately $5 \times 10^{22}$ counts/cm$^3$, is formed on the surfaces of the oxide insulating films 407 buried between the word liens 403 to thus optimize the amount of fixed charges in the oxide insulating films 403. Hence, the data storage characteristics of the semiconductor device can be prevented from being degraded.

Optimization of the amount of fixed charges can be achieved on the following ground. Namely, the amount of fixed charges in the oxide insulating film (between gate electrodes) can be changed by providing a silicon nitride film formed on an oxide insulating film while the amount of fixed charges can be controlled according to the amount of hydrogen bonding in the silicon nitride film, whereby both an electron injection profile in writing operation and a hole injection profile in erasing operation can be optimized. Hence, data storage characteristics of the memory cells can be prevented form being degraded.

Embodiment 2: Fabrication Method

Figure 5A:
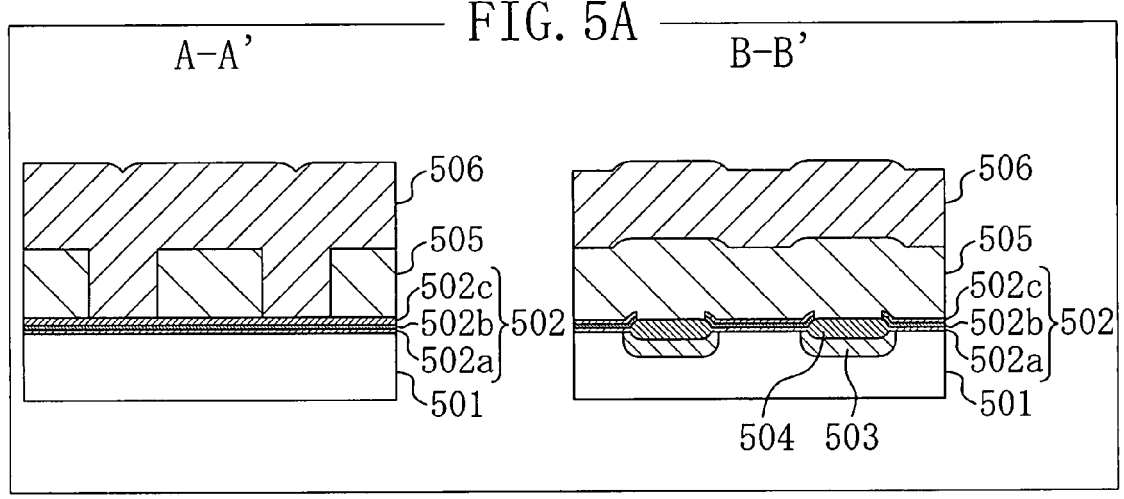
FIG. 5A to FIG. 5C are sectional views showing steps of a semiconductor device fabrication method according to Embodiment 2 of the present invention.
Figure 5B:
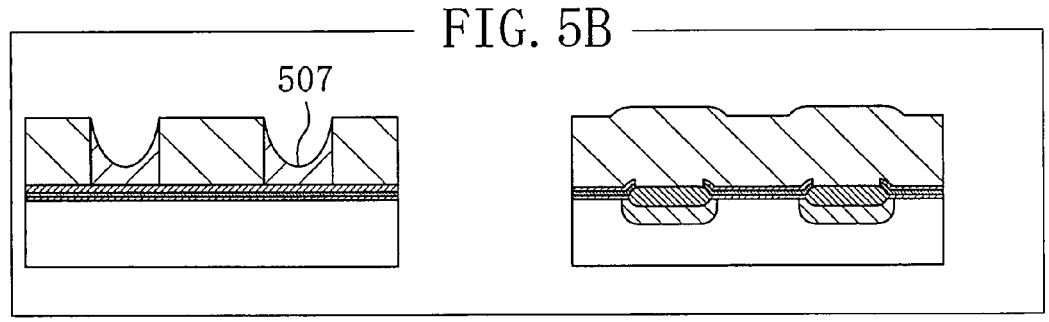
Figure 5C:
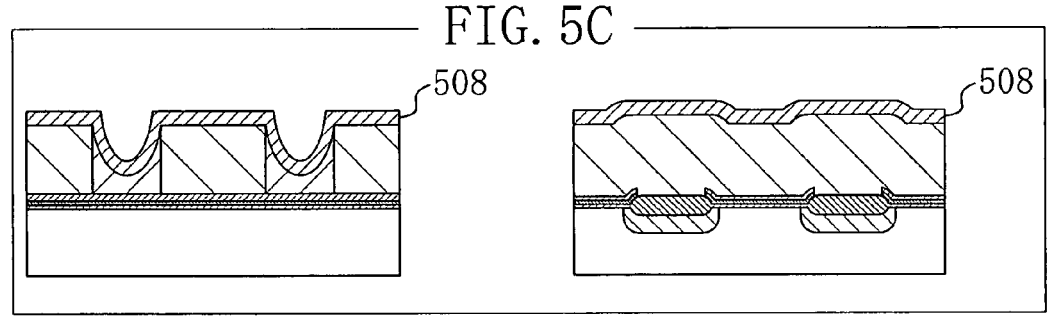
Figure 6A:
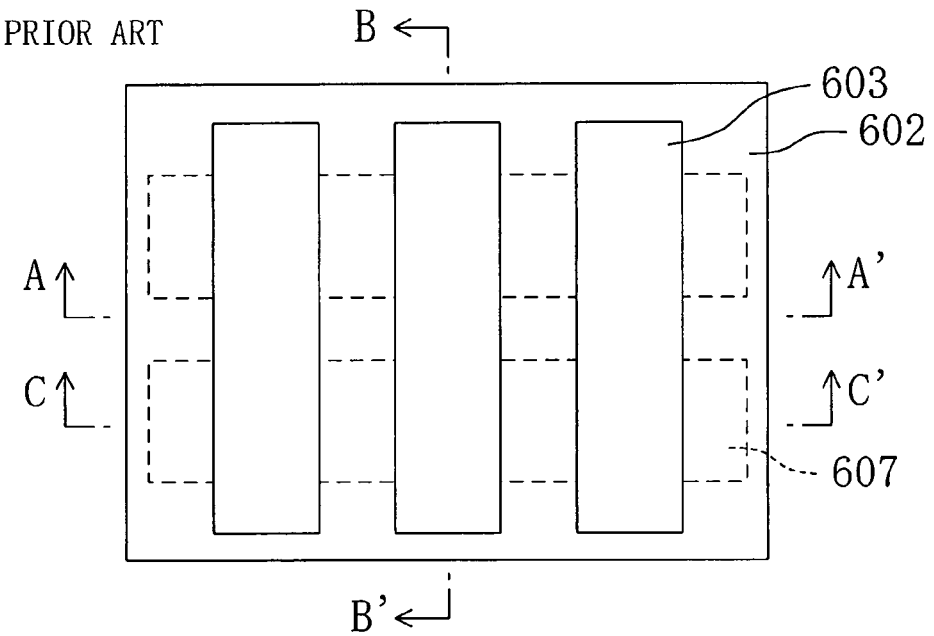
FIG. 6A is a plan view and FIG. 6B to FIG. 6D are sectional views for showing a structure of a conventional MONOS nonvolatile semiconductor memory device.
Figure 6B:
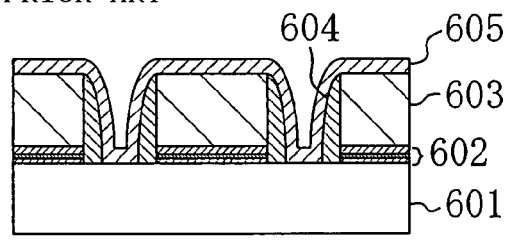
Figure 6C:
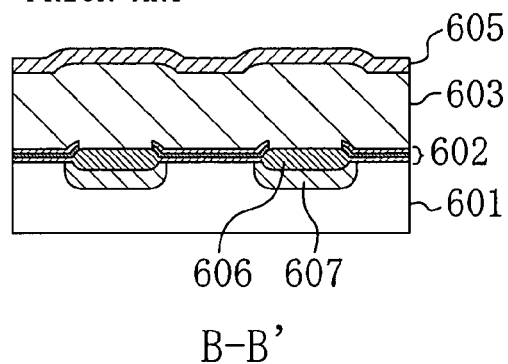
Figure 6D:
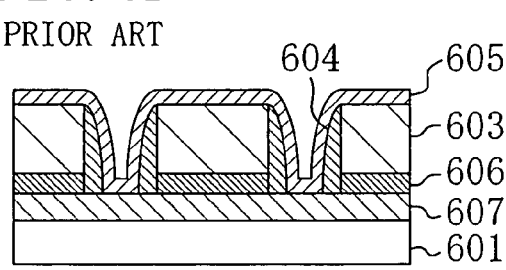
Figure 7A:
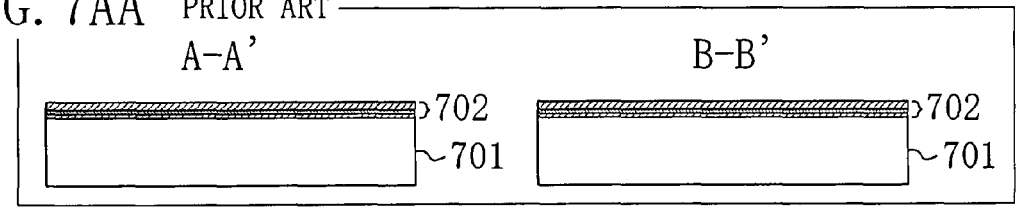
FIG. 7A(a) to FIG. 7A(g) are sectional views showing steps of a conventional MONOS nonvolatile semiconductor memory device fabrication method.
Figure 7A:
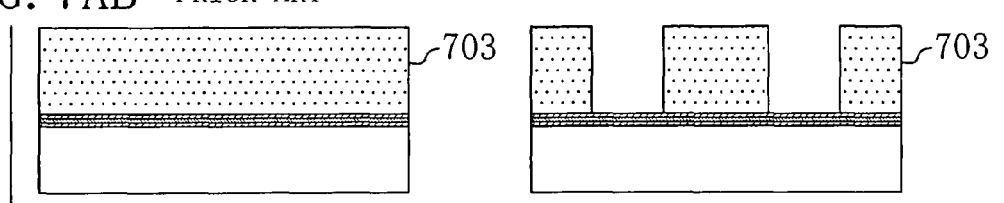
Figure 7A:
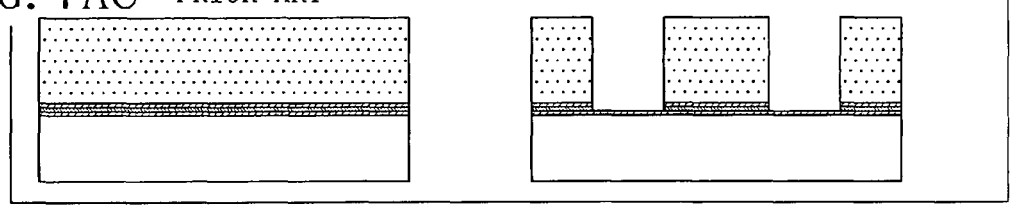
Figure 7A:
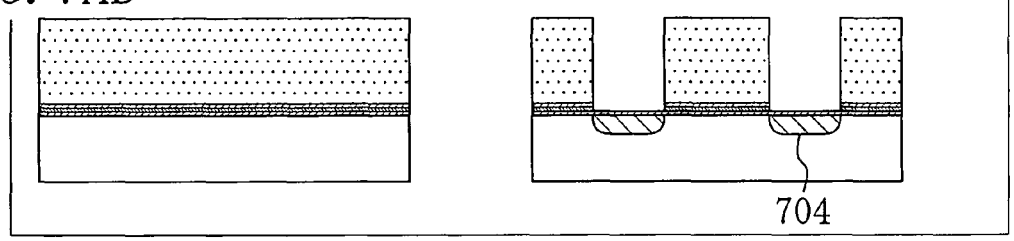
Figure 7A:
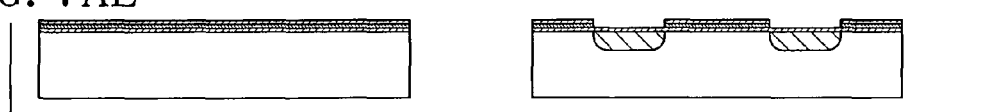
Figure 7A:
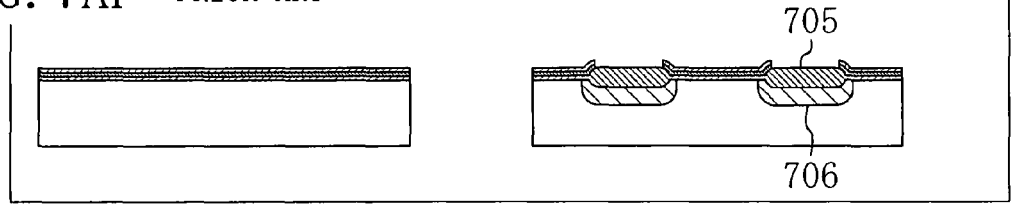
Figure 7A:
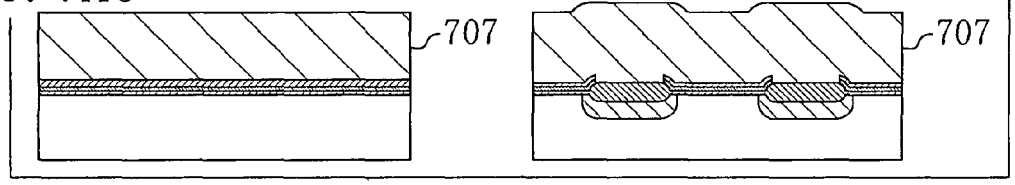
Figure 7B:
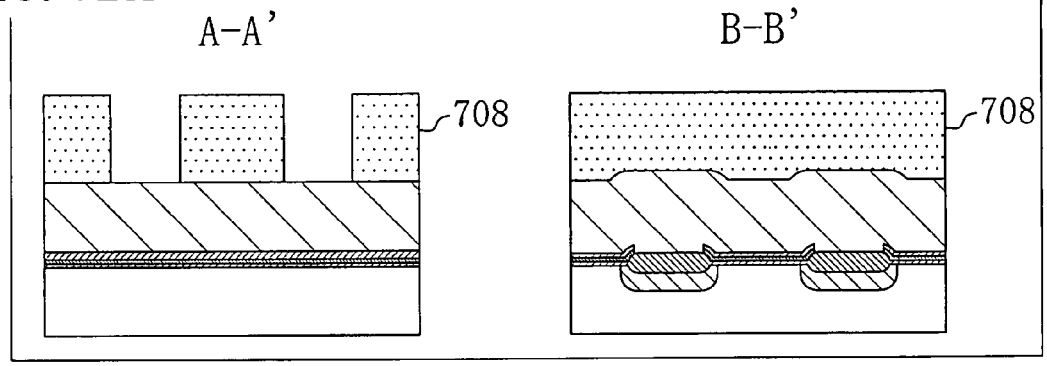
FIG. 7B(a) to FIG. 7B(e) are sectional views showing steps of the conventional MONOS nonvolatile semiconductor memory device fabrication method.
Figure 7B:
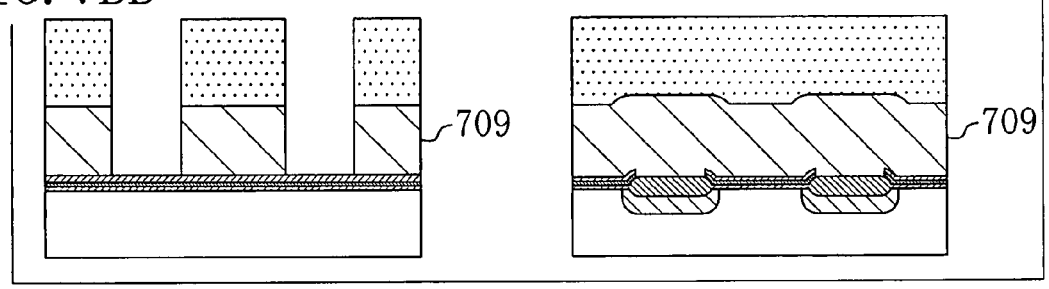
Figure 7B:
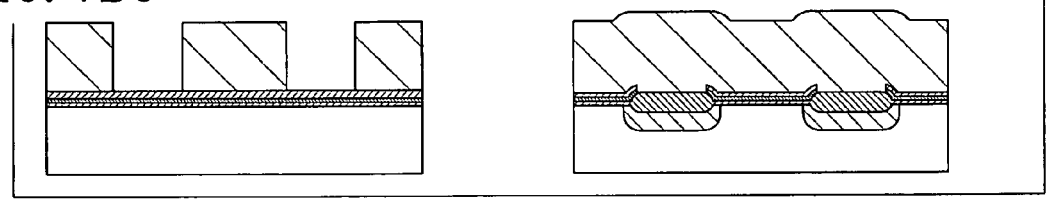
Figure 7B:
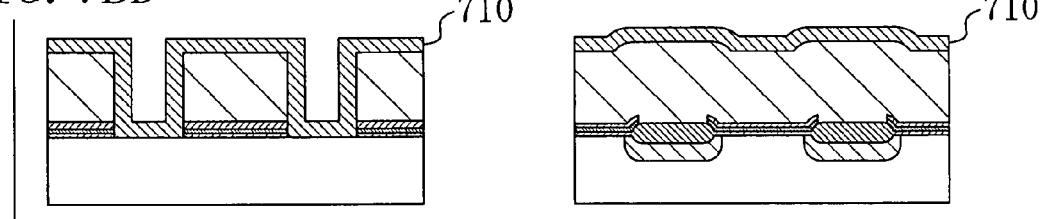
Figure 7B:
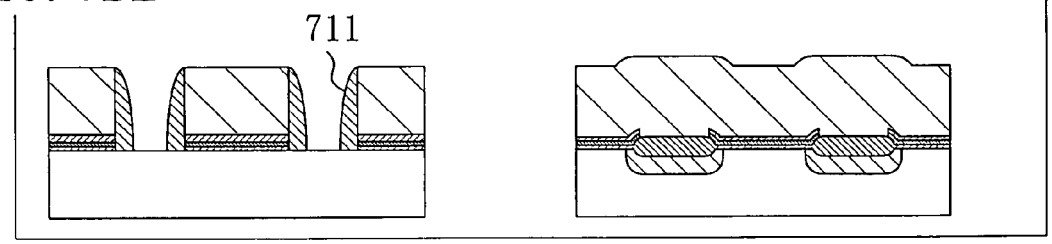
Figure 7C:
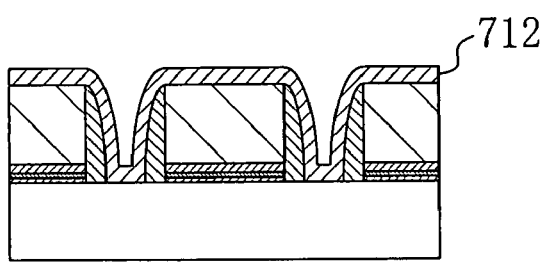
FIG. 7C presents sectional views showing a step of the conventional MONOS nonvolatile semiconductor memory device fabrication method.
Figure 7C:
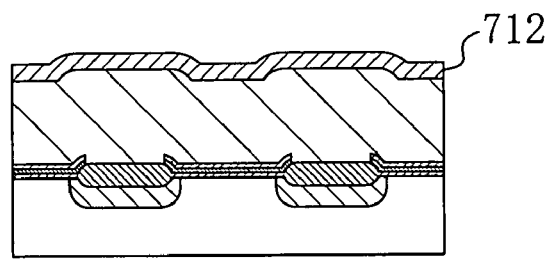
Figure 8A:
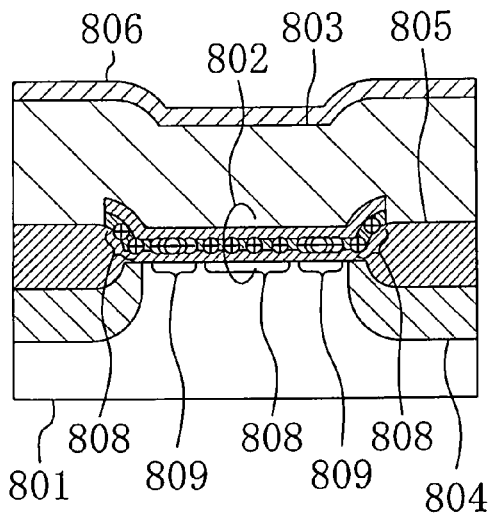
FIG. 8A shows a conventional MONOS nonvolatile semiconductor memory device.
Figure 8D:
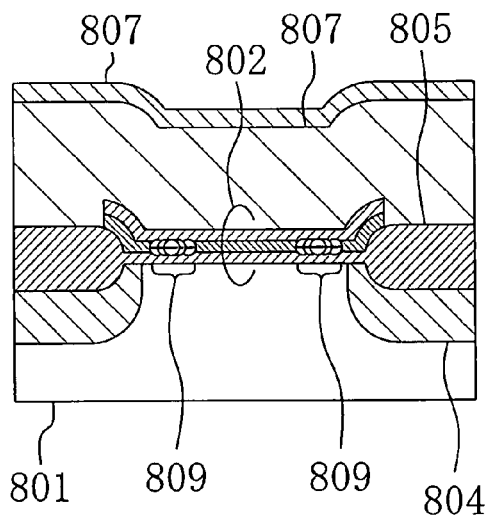
FIG. 8D shows a semiconductor device according to one embodiment of the present invention.
Figure 8B:
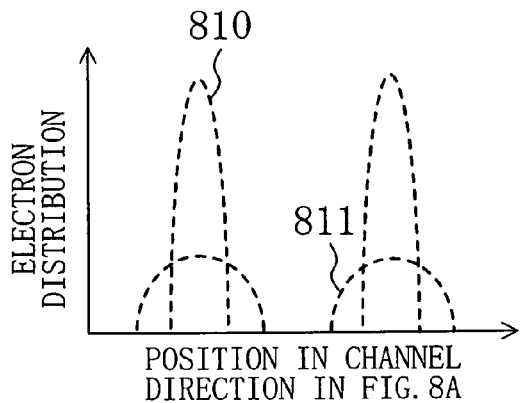
FIG. 8B shows distributions of charges in an ONO film of the conventional MONOS nonvolatile semiconductor memory device.
Figure 8E:
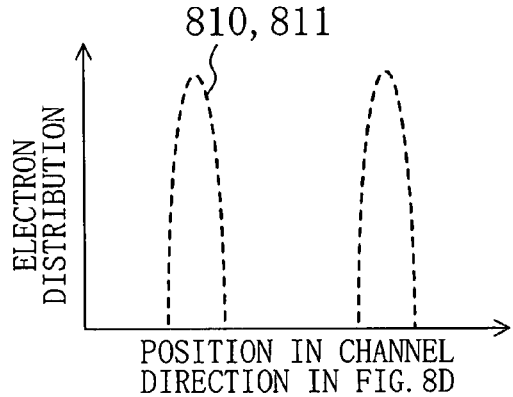
FIG. 8E shows distributions of charges in an ONO film in the embodiment of the present invention.
Figure 8C:
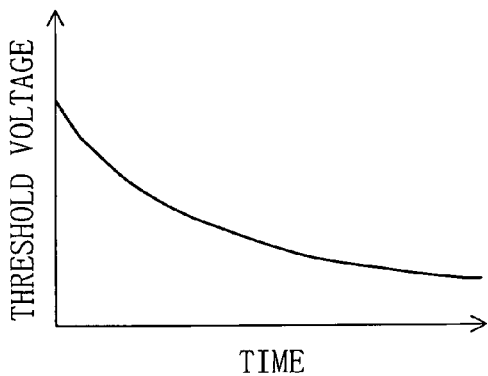
FIG. 8C is a graph showing time dependency of threshold voltage in the conventional MONOS nonvolatile semiconductor memory device.
Figure 8F:
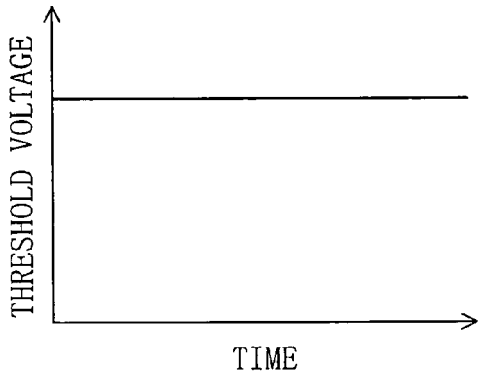
FIG. 8F is a graph showing time dependency of threshold voltage in the embodiment of the present invention.
Figure 9A:
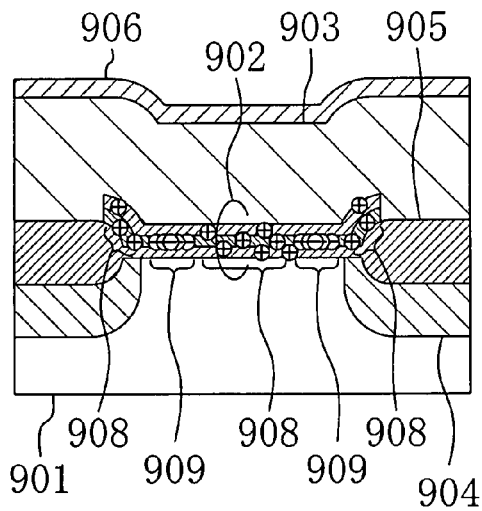
FIG. 9A shows a conventional MONOS nonvolatile semiconductor memory device.
Figure 9D:
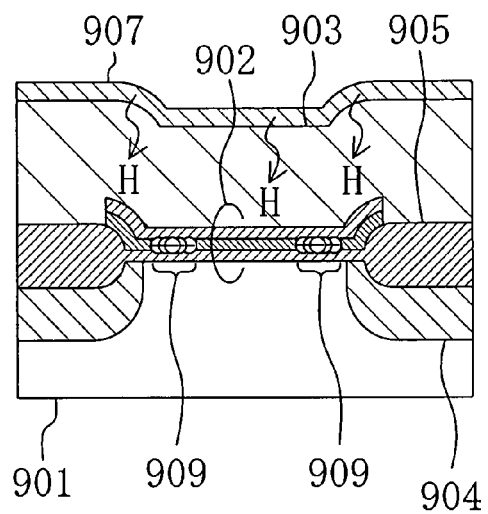
FIG. 9D shows a semiconductor device according to one embodiment of the present invention.
Figure 9B:
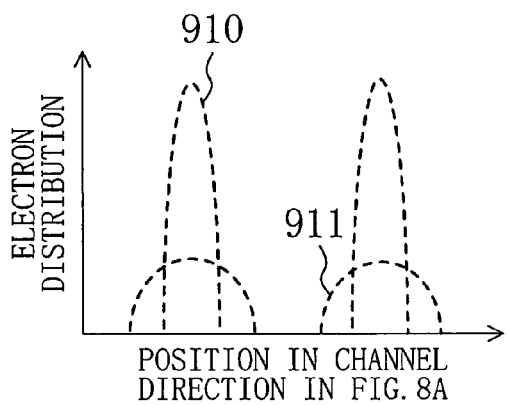
FIG. 9B shows distributions of charges in an ONO film of the MONOS nonvolatile semiconductor memory device.
Figure 9E:
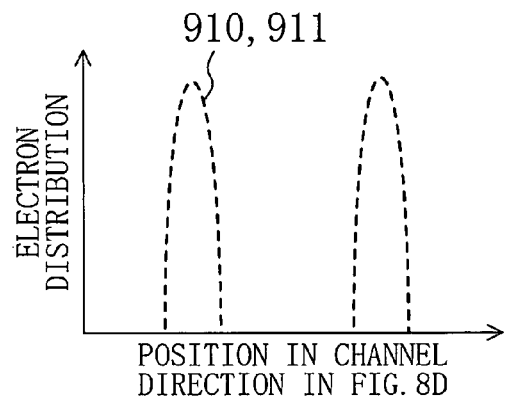
FIG. 9E shows distributions of charges in an ONO film in the embodiment of the present invention.
Figure 9C:
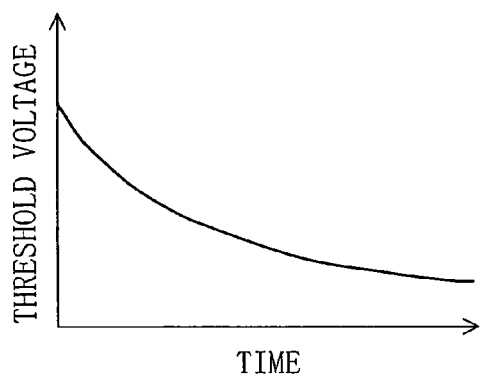
FIG. 9C is a graph showing time dependency of threshold voltage in the conventional MONOS nonvolatile semiconductor memory device.
Figure 9F:
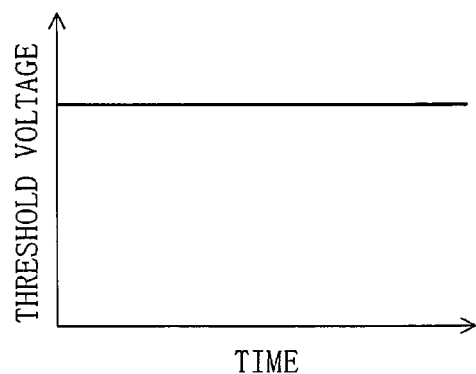
FIG. 9F is a graph showing time dependency of threshold voltage in the embodiment of the present invention.
Figure 10:
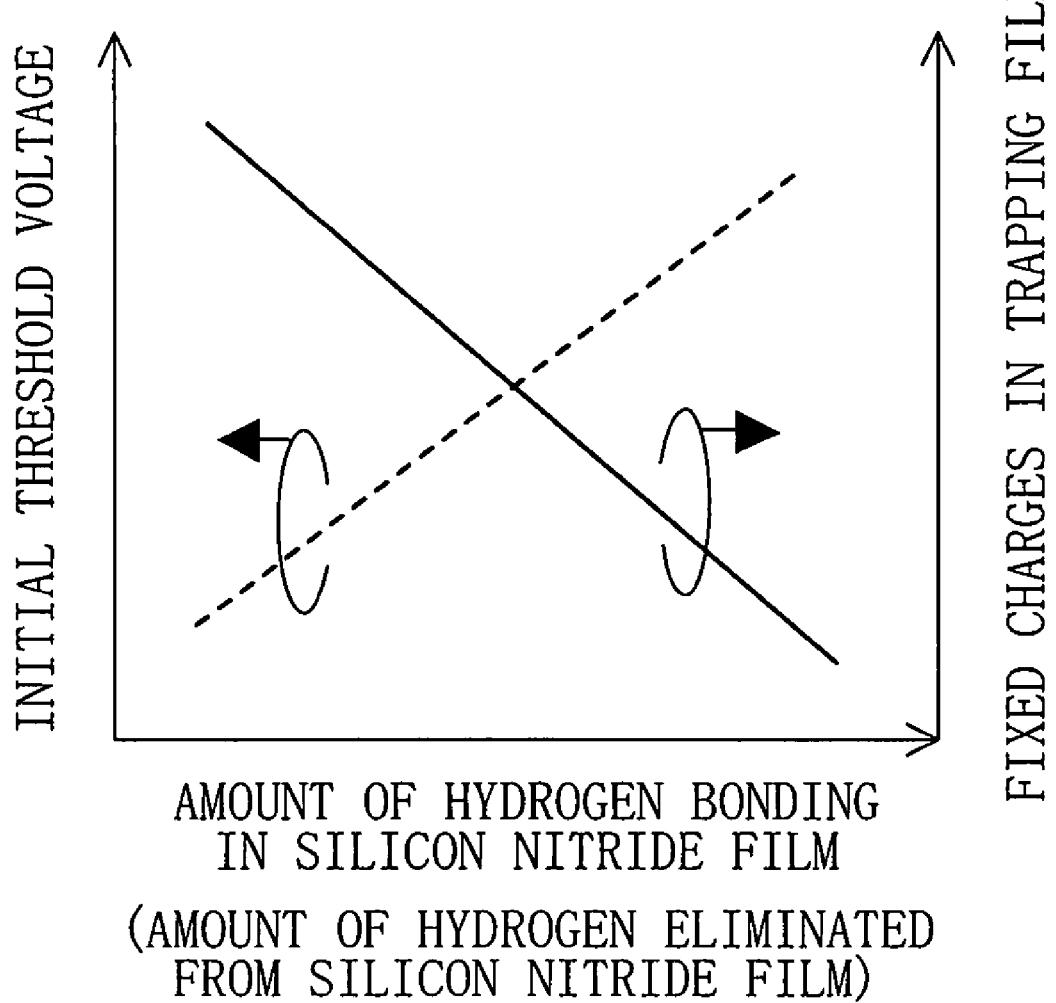
FIG. 10 is a graph showing relationships between amount of hydrogen bonding in a silicon nitride film and initial threshold voltage or amount of fixed charges in a trapping film.

FIG. 5A to FIG. 5C are sectional views taken along the lines A-A' and B-B' in FIG. 4 for showing steps of a semiconductor device fabrication method according to Embodiment 2 of the present invention.

The former steps of the fabrication method in the present embodiment are just the same as those shown in FIG. 2A and FIG. 2B(a) to FIG. 2B(c), and therefore, the description thereof is omitted.

After the fabrication steps shown in FIG. 2A and FIG. 2B(a) to FIG. 2B(c), an oxide insulating film 506 having a thickness of approximately 500 nm is formed with the use of TEOS as a material so as to cover the surfaces of the word lines 505, the side faces of the word lines 505, and the surface of the ONO film 505, as shown in FIG. 5A.

Next, as shown in FIG. 5B, the oxide insulating film 506 is removed by dry etching so that the surface of the word liens 505 is exposed while the oxide insulating film 506 is left on the ONO film 502, thereby leaving the oxide insulating films 507 buried between the word lines 505.

Subsequently, as shown in FIG. 5C, low pressure CVD using bis(tertiary-butylamino)silane (BTBAS) or hexamethyldisilazane (HMDS) as a material thereof is performed to form a silicon nitride film 508 that covers the surfaces of the word lines 505 and the surfaces of the oxide insulating films 507. The silicon nitride film 508 has a thickness in the range between 5 nm and 100 nm, both inclusive (approximately 30 nm in the present embodiment as one example), an amount of hydrogen bonding of approximately $5\times10^{22}$ counts/cm$^3$, a hydrogen content of approximately $5\times10^{22}$ atoms/cm$^3$, and a carbon content of approximately $5\times10^{21}$ atoms/cm$^3$. Thermal treatment under a nitrogen atmosphere at a temperature of, for example, 650° C. may be performed for 30 minutes after formation of the silicon nitride film 508.

As described above, in Embodiment 2, the silicon nitride film 508 is formed by low pressure CVD using an organic material, thereby causing no plasma charging to the ONO film 502. Further, the low pressure CVD uses bis(tertiary-butylamino)silane or hexamethyldisilane as a material thereof to form the silicon nitride film 509 having an amount of hydrogen bonding of approximately $5\times10^{22}$ counts/cm$^3$, which is comparatively larger than a silicon nitride film formed by low pressure CVD using the conventionally used materials of silane ($SiH_4$) and ammonia ($NH_3$), thereby suppressing generation of fixed charges in the ONON film 502. In addition, the silicon nitride film 508 having a comparatively large amount of hydrogen bonding of approximately $5\times10^{22}$ counts/cm$^3$ is formed on the surfaces of the oxide insulating films 507 buried between the word lines 505, thereby optimizing the amount of fixed charges in the oxide insulating films 507. Hence, the data storage characteristics of the semiconductor device can be prevented from being degraded.

Optimization of the amount of fixed charges can be achieved on the following ground. Namely, the amount of fixed charges in the oxide insulating film (between gate electrodes) can be changed by providing a silicon nitride film formed on an oxide insulating film while the amount of fixed charges can be controlled according to the amount of hydrogen bonding in the silicon nitride film, whereby both an electron injection profile in writing operation and a hole injection profile in erasing operation can be optimized. Hence, data storage characteristics of the memory cells can be prevented form being degraded.

As described above, the semiconductor device and the fabrication method thereof according to the present invention prevent degradation of the data storage characteristics of the memory cells to attain a highly reliable semiconductor device and are, therefore, useful for semiconductor devices including a trapping film and word lines provided in MONOS nonvolatile semiconductor memory devices, and the like.

What is claimed is:

1. A semiconductor device fabrication method comprising:
    a first step of forming source/drain regions in a semiconductor substrate;
    a second step of forming, in a region on the semiconductor substrate which includes a region on a channel region between the source/drain regions, a trapping film that stores information by accumulating charges;
    a third step of forming gate electrodes on the trapping film; and
    a fourth step of forming a silicon nitride film by low pressure CVD using an organic material so as to cover the gate electrodes and a part of the trapping film which is exposed and located between gate electrodes adjacent to each other.

2. The semiconductor device fabrication method of claim 1, further comprising, after the third step and before the fourth step, the steps of:
    forming a silicon oxide film on a part of the trapping film which is exposed and located between the gate electrodes adjacent to each other; and
    leaving the silicon oxide film buried between the gate electrodes adjacent to each other by removing a part of the silicon oxide film by anisotropic etching until the surfaces of the gate electrodes are exposed.

3. The semiconductor device fabrication method of claim 1,
    wherein the organic material includes at least one of bis (tertiary-butylamino)silane and hexamethyldisilazane.

4. The semiconductor device fabrication method of claim 1, further comprising the step of:
    performing thermal treatment after the fourth step.

5. The semiconductor device fabrication method of claim 4,
    wherein the thermal treatment is performed at a temperature between 400 ° C. and 1100 ° C., both inclusive.

6. The semiconductor device fabrication method of claim 4,
    wherein the thermal treatment is performed for a period between one minute and 60 minutes, both inclusive.

7. The semiconductor device fabrication method of claim 1,
    wherein the trapping film is an insulating film containing nitrogen.

8. The semiconductor device fabrication method of claim 1, wherein the silicon nitride film has a thickness in a range between 5 nm and 100 nm, both inclusive.

9. The semiconductor device fabrication method of claim 1,
wherein the silicon nitride film has an amount of hydrogen bonding in a range between $10^{20}$ to $10^{24}$ counts/cm$^3$, both inclusive.

10. The semiconductor device fabrication method of claim 1,
wherein the silicon nitride film has a hydrogen concentration in a range between $10^{20}$ and $10^{24}$ atoms/cm$^3$, both inclusive and a carbon concentration in a range between $10^{18}$ and $10^{24}$ atmos/cm$^3$, both inclusive.

* * * * *